US009252301B2

(12) United States Patent
Morigami et al.

(10) Patent No.: US 9,252,301 B2
(45) Date of Patent: Feb. 2, 2016

(54) SOLAR CELL AND METHOD FOR MANUFACTURING SOLAR CELL

(75) Inventors: Mitsuaki Morigami, Izumiotsu (JP); Yuji Hishida, Osaka (JP); Daisuke Ide, Kobe (JP); Hitoshi Sakata, Higashi-Osaka (JP); Takahiro Mishima, Kobe (JP); Hiroyuki Mori, Kaiduka (JP); Masato Shigematsu, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 13/594,201

(22) Filed: Aug. 24, 2012

(65) Prior Publication Data

US 2013/0247970 A1 Sep. 26, 2013

Related U.S. Application Data

(63) Continuation of application No. PCT/JP2011/054310, filed on Feb. 25, 2011.

(30) Foreign Application Priority Data

Feb. 26, 2010 (JP) ................................ 2010-042330

(51) Int. Cl.
*H01L 31/068* (2012.01)
*H01L 31/0224* (2006.01)
(Continued)

(52) U.S. Cl.
CPC .... *H01L 31/022441* (2013.01); *H01L 31/0682* (2013.01); *H01L 31/0747* (2013.01); *H01L 31/1804* (2013.01); *H01L 31/1884* (2013.01); *Y02E 10/547* (2013.01); *Y02P 70/521* (2015.11)

(58) Field of Classification Search
CPC .................................................. H01L 31/0682
See application file for complete search history.

(56) References Cited

U.S. PATENT DOCUMENTS 7,339,110 B1 * 3/2008 Mulligan et al. .............. 136/256
8,258,050 B2 * 9/2012 Cho et al. ...................... 438/487

(Continued)

FOREIGN PATENT DOCUMENTS

DE 102008030880 A1 6/2009
JP 2008-529265 A 7/2008

(Continued)

OTHER PUBLICATIONS

"below, adv. and prep." OED Online. Oxford University Press, Dec. 2014. Web. Dec. 16, 2014.*

(Continued)

*Primary Examiner* — Jennifer Michener
*Assistant Examiner* — Magali P Slawski
(74) *Attorney, Agent, or Firm* — Marvin A. Motsenbocker; Mots Law, PLLC

(57) ABSTRACT

A solar cell includes semiconductor substrate of a first conductivity type; first semiconductor layer having a first conductivity type; second semiconductor layer having a second conductivity type; first electrode; second electrode; and insulating layer. First semiconductor layer and second semiconductor layer are formed on rear surface. When one end portion of insulating layer which is formed on first semiconductor layer and which is on a side close to first electrode is defined as first insulating-layer end portion and another end portion of insulating layer on a side close to second electrode is defined as second insulating-layer end portion in arrangement direction x, a distance from end point of second-semiconductor-layer end portion in contact with rear surface to second insulating-layer end portion in arrangement direction x is shorter than a distance from end point to first insulating-layer end portion in arrangement direction x.

21 Claims, 14 Drawing Sheets

1A
50n 55n 52n
60
55p 52p 50p
30p
40
45a
45b
20n
27
39
37
12
10n
z
x
Ln
Lp

(51) Int. Cl.
*H01L 31/18* (2006.01)
*H01L 31/0747* (2012.01)

(56) References Cited

U.S. PATENT DOCUMENTS

| | | | | |
|---|---|---|---|---|
| 2004/0112426 | A1 * | 6/2004 | Hagino | 136/261 |
| 2008/0061293 | A1 | 3/2008 | Ribeyron et al. | |
| 2010/0059109 | A1 * | 3/2010 | Nakayashiki et al. | 136/255 |
| 2011/0023956 | A1 | 2/2011 | Harder | |

FOREIGN PATENT DOCUMENTS

| | | | |
|---|---|---|---|
| JP | 2009-200267 | A | 9/2009 |
| WO | 2009074469 | A2 | 6/2009 |

OTHER PUBLICATIONS

"above, adv., prep., n., and adj." OED Online. Oxford University Press, Dec. 2014. Web. 16 Dec. 2014.*

* cited by examiner 12
10n
45b
27
40
25n
22i
20n
x
z 30p
35p
32i
12
10n
45b
37
39
27
40
25n
22i
20n
x
z 52
35p
32i
30p
12
10n
45b
37
39
27
40
Ln
40M
45a
25n
22i
20n
x
z 60
52p
35p
32i
30p
12
10n
30pM
45b
37
39
60M
27
L60
L40
40
Ln
40M
45a
52n
25n
22i
20n
x
z 1C
60
50n
55n
52n
30n
35n
32i
12
10p
45b
37
39
27
60M
Lp
40M
40
45a
L60
L40
20pM
55p
52p
25p
22i
50p
20p
x
z

SOLAR CELL AND METHOD FOR MANUFACTURING SOLAR CELL

CROSS REFERENCE TO RELATED APPLICATIONS

This application is a continuation application of International Application No. PCT/JP2011/054310, filed on Feb. 25, 2011, entitled "SOLAR CELL AND METHOD FOR MANUFACTURING SOLAR CELL", which claims priority based on Article 8 of Patent Cooperation Treaty from prior Japanese Patent Applications No. 2010-042330, filed on Feb. 26, 2010, the entire contents of which are incorporated herein by reference.

BACKGROUND OF THE INVENTION

1. Field of the Invention

This disclosure relates to a solar cell of a rear junction type in which an n-type semiconductor layer and a p-type semiconductor layer are formed on a rear surface of a semiconductor substrate and also relates to a method for manufacturing the solar cell.

2. Description of Related Art

A solar cell can convert clean and unlimitedly-supplied solar energy directly into electric energy and is therefore expected to be a new energy source.

A solar cell in which an n-type semiconductor layer and a p-type semiconductor layer are formed on a rear surface of a semiconductor substrate, or a so-called rear junction type solar cell, has been conventionally known (For example, see Document 1).

FIG. 1 is a cross-sectional view of conventional rear junction type solar cell 100. As shown in FIG. 1, in solar cell 100, n-type semiconductor layer 120 and p-type semiconductor layer 130 are formed on a rear surface of n-type semiconductor substrate 110. Insulating layer 140 is formed to be laid on n-type semiconductor layer 120 and p-type semiconductor layer 130. Short circuit between p-side electrode 150*p* and n-side electrode 150*n* is prevented by forming isolation grooves 160 for p-side electrodes 150*p* and n-side electrodes 150*n* on insulating layer 140.

Document 1: Japanese Patent Application Publication No. 2009-200267

SUMMARY OF THE INVENTION

In solar cell 100, carriers (electrons and holes) are generated in semiconductor substrate 110 when solar cell 100 receives light. Carriers include majority carriers and minority carriers. When the conductivity type of semiconductor substrate 110 is n-type, the majority carriers are electrons and the minority carriers are holes. As shown in FIG. 1, when hole 5 generated in n-type semiconductor substrate 110 near n-type semiconductor layer 120 moves to p-side electrode 150*p*, hole 5 needs to travel through a portion near a junction between p-type semiconductor layer 130 covered with insulating layer 140 and semiconductor substrate 110. While traveling through this portion, hole 5 tends to recombine with an electron being the majority carrier. When the recombination occurs, the number of carriers extracted from electrode 150 decreases and there is a risk of reduction in conversion efficiency. The same occurs in a p-type semiconductor substrate in which the minor carriers are electrons.

An object of an embodiment of the invention is to provide a solar cell in which recombination of minority carriers is reduced and the conversion efficiency is thereby improved, and to provide a method for manufacturing the solar cell.

An aspect of the invention includes the following characteristics to solve the problem described above. In the embodiment of the invention, a solar cell (solar cell 1) comprises: a semiconductor substrate (semiconductor substrate 10*n*) of a first conductivity type having a light-receiving surface and a rear surface (rear surface 12); a first semiconductor layer (first semiconductor layer 20*n*) having the first conductivity type; a second semiconductor layer (second semiconductor layer 30*p*) having a second conductivity type; a first electrode (first electrode 50*n*) electrically connected to the first semiconductor layer; a second electrode (second electrode 50*p*) electrically connected to the second semiconductor layer; and an insulating layer (insulating layer 40) having insulation properties, wherein the first semiconductor layer and the second semiconductor layer are formed on the rear surface, and when an end portion of the first semiconductor layer is defined as a first-semiconductor-layer end portion (first-semiconductor-layer end portion 27), an end portion of the second semiconductor layer which is adjacent to the first semiconductor layer is defined as a second-semiconductor-layer end portion (second-semiconductor-layer end portion 37), one end portion of the insulating layer which is formed on the first semiconductor layer and which is on the first electrode side is defined as a first insulating-layer end portion (first insulating-layer end portion 45*a*), and another end portion of the insulating layer on the second electrode side is defined as a second insulating-layer end portion (second insulating-layer end portion 45*b*), in an arrangement direction (arrangement direction x) in which the first semiconductor layer and the second semiconductor layer are alternately arranged, a distance from an end point (end point 39) of the second-semiconductor-layer end portion in contact with the rear surface to the second insulating-layer end portion in the arrangement direction is shorter than a distance from the end point to the first insulating-layer end portion in the arrangement direction.

In the embodiment, the distance from the endpoint of the second-semiconductor-layer end portion in contact with the rear surface to the second insulating-layer end portion in the arrangement direction is shorter than the distance from the end point to the first insulating-layer end portion in the arrangement direction. This reduces the distance that the minor carriers generated near the first semiconductor layer travel through a portion near a junction between the semiconductor substrate and the second semiconductor layer covered with the insulating layer, when the minor carriers move to the second electrode. Accordingly, in the solar cell of the embodiment, the recombination of minor carries under the second semiconductor layer can be reduced compared to a solar cell in which the width of the insulating layer in the arrangement direction is the same.

Moreover, the distance from the end point to the second insulating-layer end portion in the arrangement direction is 0.1 mm or smaller.

Furthermore, the second insulating-layer end portion and the first-semiconductor-layer end portion are arranged side by side.

In addition, the second insulating-layer end portion and the first-semiconductor-layer end portion are at the same position in the arrangement direction.

Moreover, the solar cell further comprises an isolation groove for preventing short circuit and, when a semiconductor layer having a p-type conductivity out of the first semiconductor layer formed on the rear surface and the second semiconductor layer formed on the rear surface is defined as a p-type semiconductor layer, a center of the isolation groove is closer to a center of the p-type semiconductor layer than a center of the insulating layer is in the arrangement direction.

Furthermore, a method for manufacturing a solar cell comprises: a first semiconductor layer formation step of forming a first semiconductor layer having a first conductivity type on a rear surface of a semiconductor substrate of the first conductivity type, the semiconductor substrate having a light-receiving surface configured to receive light and the rear surface provided on an opposite side to the light-receiving surface; a second semiconductor layer formation step of forming a second semiconductor layer having a second conductivity type on the rear surface; and an insulating layer formation step of forming an insulating layer having insulation properties, wherein the steps are performed in the order of the first semiconductor layer formation step, the insulating layer formation step, and the second semiconductor layer formation step, and the second semiconductor layer formation step includes the steps of: removing part of the insulating layer formed on the first semiconductor layer; removing the first semiconductor layer exposed by the removal of the insulating layer; and forming the second semiconductor layer on the semiconductor substrate exposed by the removal of the first semiconductor layer.

In addition, the method for manufacturing a solar cell further comprises an isolation groove formation step of forming an isolation groove for preventing short circuit and, when a semiconductor layer having a p-type conductivity out of the first semiconductor layer formed on the rear surface and the second semiconductor layer formed on the rear surface is defined as a p-type semiconductor layer, in the isolation groove formation step, a center of the isolation groove is formed to be closer to a center of the p-type semiconductor layer than a center of the insulating layer is in an arrangement direction in which the first semiconductor layer and the second semiconductor layer are alternately arranged.

The aspects of embodiments can provide a solar cell in which recombination of minority carriers is reduced and conversion efficiency is thereby improved and provide a method for manufacturing the solar cell.

DETAILED DESCRIPTION OF EMBODIMENTS

Figure 1:
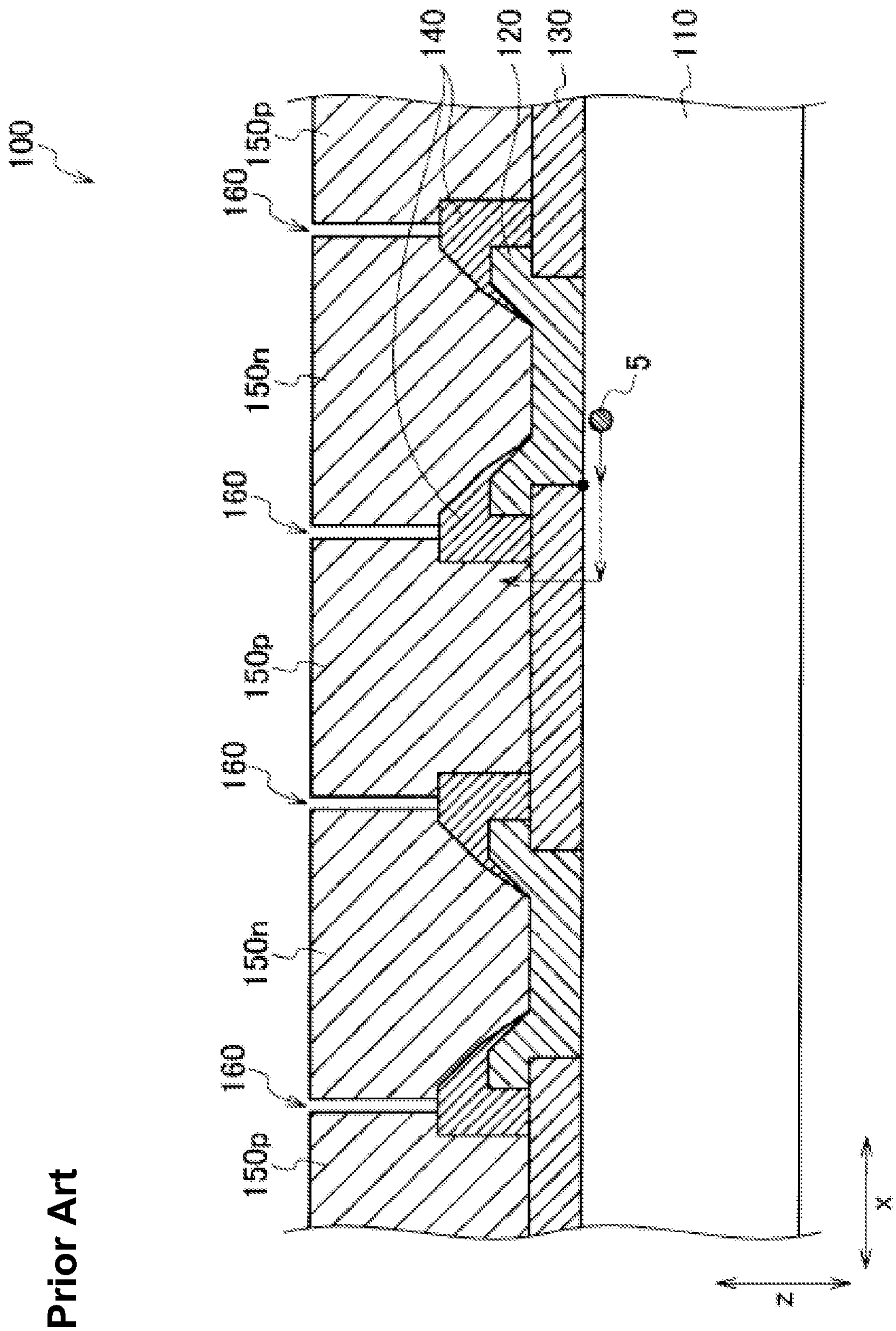
FIG. 1 is a cross-sectional view of conventional rear junction type solar cell 100.

An example of solar cell 1 according to an embodiment of the invention is described with reference to the drawings. In the drawings described below, the same or similar parts are denoted by the same or similar reference numerals. Note that the drawings are schematic and proportions of dimensions and the like are different from actual ones. Accordingly, specific dimensions and the like should be determined in consideration of the descriptions below. Moreover, parts where relations and proportions of the dimensions are different among the drawings are included as a matter of course.

(1) Overall Configuration of Solar Cell 1A

Figure 2:
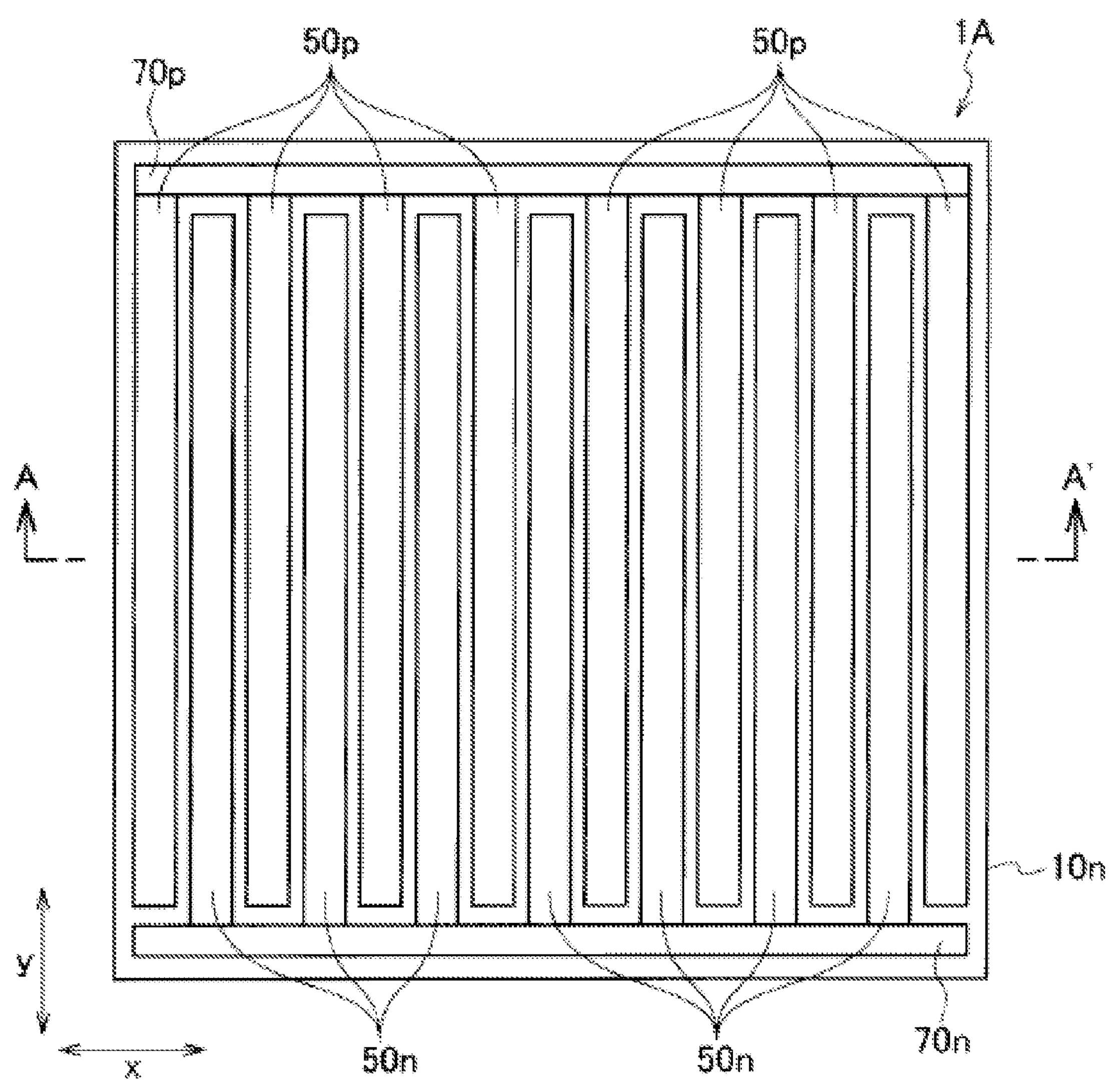
FIG. 2 is a plan view of solar cell 1A according to an embodiment of the invention which is viewed from a rear surface 12 side.
Figure 3:
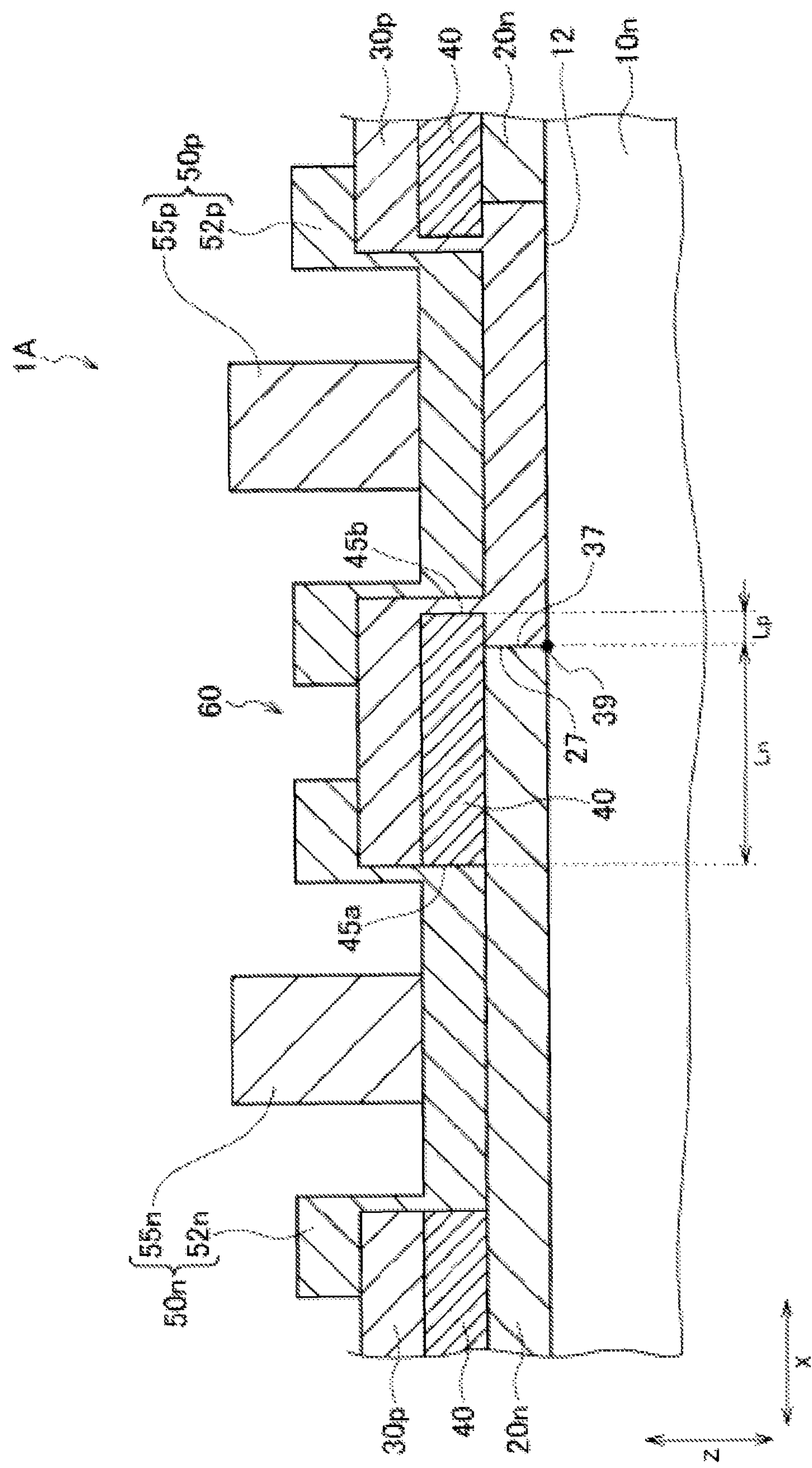
FIG. 3 is a cross-sectional view taken along the line A-A' in FIG. 2.

An overall configuration of solar cell 1A according to the embodiment of the invention is described with reference to FIGS. 2 and 3. FIG. 2 is a plan view of solar cell 1A according to the embodiment of the invention which is viewed from a rear surface 12 side. FIG. 3 is a cross-sectional view taken along the line A-A' in FIG. 2.

As shown in FIGS. 2 and 3, solar cell 1A includes semiconductor substrate 10*n*, first semiconductor layer 20*n*, second semiconductor layer 30*p*, insulating layer 40, first electrodes 50*n*, second electrodes 50*p*, connection electrode 70*n*, and connection electrode 70*p*.

Semiconductor substrate 10*n* has a light-receiving surface configured to receive light and rear surface 12 provided on the opposite side to the light-receiving surface. Semiconductor substrate 10*n* receives light in the light-receiving surface and thereby generates carriers (electrons and holes).

Semiconductor substrate 10*n* can be made of general semiconductor materials including crystal-based semiconductor materials such as single-crystal Si and polycrystalline Si which have an n-type or p-type conductivity and compound semiconductor materials such as GaAs and InP. Minor recesses and protrusions may be formed in the light-receiving surface and rear surface 12 of semiconductor substrate 10*n*. Although not illustrated, no structural bodies (for example, electrodes and the like) which block incidence of light are formed on the light-receiving surface of semiconductor substrate 10*n*. In semiconductor substrate 10*n*, the entire light-receiving surface can receive light. The light-receiving surface may be covered with a passivation layer. The passivation layer has such passivation characteristics that recombination of carriers is suppressed. The passivation layer may include, for example, a substantially intrinsic amorphous semiconductor layer formed by adding no dopant or by adding a small amount of dopant.

The conductivity type of semiconductor substrate 10*n* is a first conductivity type. In solar cell 1A, description is given of the case where semiconductor substrate 10*n* is an n-type single-crystal silicon substrate. Accordingly, the conductivity type of semiconductor substrate 10*n* is n-type. Hence, the minority carriers are the holes.

First semiconductor layer 20*n* is formed on rear surface 12 of semiconductor substrate 10*n*. First semiconductor layer 20*n* is formed to have a longitudinal direction. This longitudinal direction is defined as longitudinal direction y. First semiconductor layer 20*n* has the first conductivity type which is the same as the conductivity type of semiconductor substrate 10*n*. First semiconductor layer 20*n* is formed of an n-type amorphous semiconductor layer. In this configuration (so-called BSF structure), recombination of carries at an interface between first semiconductor layer 20*n* and rear surface 12 of semiconductor substrate 10*n* can be suppressed.

Second semiconductor layer 30*p* is formed on rear surface 12 of semiconductor substrate 10*n*. Second semiconductor layer 30*p* is formed to have longitudinal direction y. Second semiconductor layer 30*p* has a second conductivity type which is different from the conductivity type of semiconductor substrate 10*n*. Second semiconductor layer 30*p* is formed of a p-type amorphous semiconductor layer. Accordingly, a junction between semiconductor substrate 10*n* and second semiconductor layer 30*p* is a pn junction. Second semiconductor layer 30*p* is formed also on insulating layer 40.

A thin intrinsic amorphous semiconductor layer may be interposed between first semiconductor layer 20*n* and rear surface 12 and between second semiconductor layer 30*p* and rear surface 12. Junction characteristics can be thereby improved.

As shown in FIG. 3, first semiconductor layer 20*n* and second semiconductor layer 30*p* are alternately arranged. This arrangement direction is defined as arrangement direction x. In solar cell 1A, arrangement direction x and longitudinal direction y are orthogonal to each other.

An end portion of first semiconductor layer 20*n* in arrangement direction x is defined as first-semiconductor-layer end portion 27. An end portion of second semiconductor layer 30*p* in arrangement direction x which is adjacent to first semiconductor layer 20*n* in arrangement direction x is defined as second-semiconductor-layer end portion 37. In second-semiconductor-layer end portion 37, a point in contact with rear surface 12 is defined as end point 39. In solar cell 1A, first-semiconductor-layer end portion 27 and second-semiconductor-layer end portion 37 are in contact with each other. Although second semiconductor layer 30*p* is formed also on insulating layer 40, second-semiconductor-layer end portion 37 refers to an end portion of second semiconductor layer 30*p* formed on rear surface 12. Accordingly, an end portion of second semiconductor layer 30*p* formed on insulating layer 40 are not second-semiconductor-layer end portion 37.

Insulating layer 40 has insulation properties. Insulating layer 40 is formed at least on first semiconductor layer 20*n*. In solar cell 1A, insulating layer 40 is formed to be laid on first semiconductor layer 20*n* and second semiconductor layer 30*p*. Aluminum nitride, silicon nitride, silicon oxide, and the like can be used for insulating layer 40.

Insulating layer 40 has end portions in arrangement direction x. One end portion of insulating layer 40 in arrangement direction x which is formed on first semiconductor layer 20*n* and which is located on a side close to first electrode 50*n* is defined as first insulating-layer end portion 45*a*. The other end portion of insulating layer 40 which is located on a side close to second electrode 50*p* in arrangement direction x is defined as second insulating-layer end portion 45*b*. Distance Ln from end point 39 to first insulating-layer end portion 45*a* in arrangement direction x is longer than distance Lp from end point 39 to second insulating-layer end portion 45*b* in arrangement direction x, i.e. distance Lp is shorter than distance Ln. In other words, insulating layer 40 is formed to be closer to first semiconductor layer 20*n* than to second semiconductor layer 30*p* in arrangement direction x. Distance Lp from end point 39 to second insulating-layer end portion 45*b* in arrangement direction x may be 0.1 mm or smaller. When distance Lp is 0.1 mm or smaller, the number of minority carriers which recombine is small and conversion efficiency is thereby improved.

First electrodes 50*n* are electrically connected to first semiconductor layer 20*n*. As shown in FIG. 2, first electrodes 50*n* are formed to extend in longitudinal direction y. Each first electrode 50*n* has transparent electrode layer 52*n* and collection electrode 55*n*. Transparent electrode layer 52*n* is formed on first semiconductor layer 20*n* and is also formed on second semiconductor layer 30*p* formed on insulating layer 40. Transparent electrode layer 52*n* is made of a conductive material having a light transmitting property. ITO (Indium Tin Oxide), tin oxide, zinc oxide, and the like can be used for transparent electrode layer 52*n*. Collection electrode 55*n* is formed on transparent electrode layer 52*n*. Collection electrode 55*n* can be formed by using a resin conductive paste which uses a resin material as a binder and conductive particles such as silver particles as a filler, or by a sputtering method using silver. Alternatively, collection electrode 55*n* can be formed by using a plating method, after an underlying metal is formed on transparent electrode layer 52*n*.

Second electrodes 50*p* are electrically connected to second semiconductor layer 30*p*. As shown in FIG. 2, first electrodes 50*p* are formed to extend in longitudinal direction y. Each second electrode 50*p* has transparent electrode layer 52*p* and collection electrode 55*p*. Transparent electrode layer 52*p* is formed on second semiconductor layer 30*p*. Collection electrode 55*p* is formed on transparent electrode layer 52*p*. Transparent electrode layer 52*p* and collection electrode 55*p* can be made of the same materials as those of transparent electrode layer 52*n* and collection electrode 55*n*, respectively.

First electrodes 50*n* and second electrodes 50*p* collect carriers. First electrodes 50*n* and second electrodes 50*p* are isolated from one another by isolation grooves 60 for preventing short circuit. Isolation grooves 60 are provided in transparent electrode 52. Isolation grooves 60 are provided in transparent electrode 52 formed on second semiconductor layer 30*p*. Accordingly, bottoms of isolation grooves 60 are second semiconductor layer 30*p*. Second semiconductor layer 30*p* herein is second semiconductor layer 30*p* formed on insulating layer 40. Isolation grooves 60 are formed to extend in longitudinal direction y. Note that, since the conductivity type of second semiconductor layer 30*p* is p-type, the conductivity thereof is low. Moreover, the thickness of second semiconductor layer 30*p* is extremely small compared to the width of isolation grooves 60. Accordingly, leaks between first electrodes 50*n* and second electrodes 50*p* via second semiconductor layer 30*p* are extremely small.

Connection electrode 70*n* is electrically connected to multiple first electrodes 50*n*. Specifically, as shown in FIG. 2, connection electrode 70*n* is connected to end portions of first electrodes 50*n*. Connection electrode 70*p* is electrically connected multiple second electrodes 50*p*. Specifically, as shown in FIG. 2, connection electrode 70*p* is connected to end portions of second electrodes 50*p*. Connection electrode 70*n* and connection electrode 70*p* further collect carriers collected by multiple first electrodes 50*n* and multiple second electrodes 50*p*.

(2) Overall Configuration of Solar Cell 1B

Figure 4:
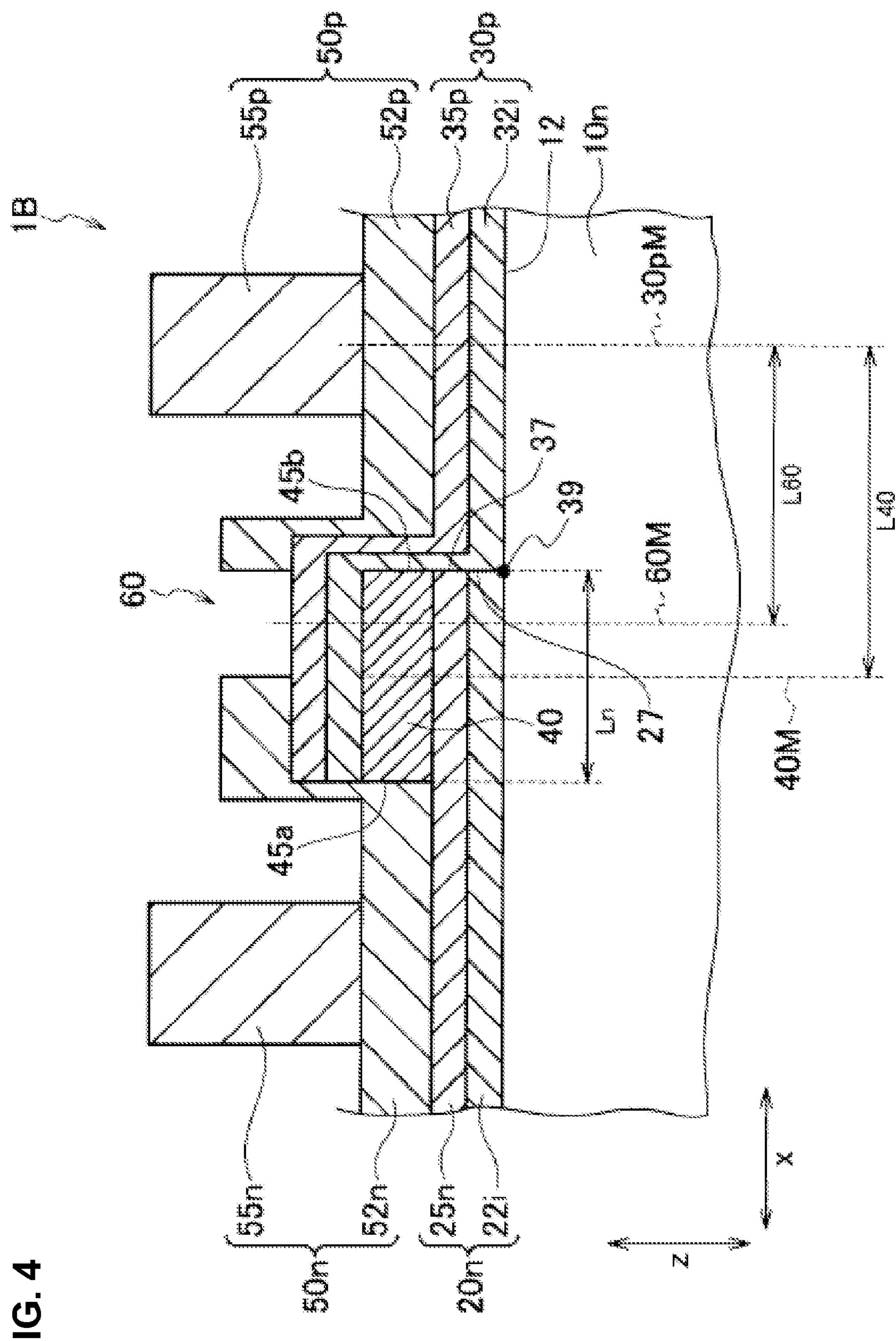
FIG. 4 is a cross-sectional view of solar cell 1B according the embodiment of the invention which is taken along a cross section extending in perpendicular direction z and arrangement direction x.

An overall configuration of solar cell 1B according to the embodiment of the invention is described with reference to FIG. 4. Descriptions of parts that are the same as those of solar cell 1A are omitted. In other words, points that are different from solar cell 1A are mainly described. FIG. 4 is a cross-sectional view of solar cell 1B according the embodiment of the invention which is taken along a cross section extending in arrangement direction x and perpendicular direction z that is perpendicular to arrangement direction x and longitudinal direction y.

As shown in FIG. 4, first semiconductor layer 20*n* includes i-type amorphous semiconductor layer 22*i* and n-type amorphous semiconductor layer 25*n*. i-type amorphous semiconductor layer 22*i* is formed on rear surface 12 of semiconductor substrate 10*n*. n-type amorphous semiconductor layer 25*n* is formed on i-type amorphous semiconductor layer 22*i*. Recombination of carriers in the rear surface of semiconductor substrate 10*n* can be suppressed in such a configuration (so-called BSF structure) of n-type semiconductor substrate 10*n*, i-type amorphous semiconductor layer 22*i*, and n-type amorphous semiconductor layer 25*n*.

As shown in FIG. 4, second semiconductor layer 30*p* includes i-type amorphous semiconductor layer 32*i* and p-type amorphous semiconductor layer 35*p*. i-type amorphous semiconductor layer 32*i* is formed on rear surface 12 of semiconductor substrate 10*n*. p-type amorphous semiconductor layer 35*p* is formed on i-type amorphous semiconductor layer 32*i*. pn junction characteristics can be improved in such a configuration (so-called "HIT" (registered trademark) structure) of n-type semiconductor substrate 10*n*, i-type amorphous semiconductor layer 32*i*, and p-type amorphous semiconductor layer 35*p*.

Each of i-type amorphous semiconductor layer 22*i*, i-type amorphous semiconductor layer 32*i*, n-type amorphous semiconductor layer 25*n*, and p-type amorphous semiconductor layer 35*p* can be made of an amorphous semiconductor containing hydrogen. Examples of such an amorphous semiconductor include amorphous silicon, amorphous silicon carbide, and amorphous silicon germanium. Materials used for the amorphous semiconductor layers are not limited to these materials and other amorphous semiconductors may be used. Each of i-type amorphous semiconductor layer 22*i*, i-type amorphous semiconductor layer 32*i*, n-type amorphous semiconductor layer 25*n*, and p-type amorphous semiconductor layer 35*p* may be made of one type of amorphous semiconductor. Each of i-type amorphous semiconductor layer 22*i*, i-type amorphous semiconductor layer 32*i*, n-type amorphous semiconductor layer 25*n*, and p-type amorphous semiconductor layer 35*p* may be made of a combination of two or more types of amorphous semiconductors.

As shown in FIG. 4, second insulating-layer end portion 45*b* and first-semiconductor-layer end portion 27 are arranged side by side. Moreover, second insulating-layer end portion 45*b* and first-semiconductor-layer end portion 27 are at the same position in arrangement direction x. The "same position" herein means almost the same position and there may be misalignment due to error.

In solar cell 1B, a semiconductor layer having a p-type conductivity is second semiconductor layer 30*p*. Isolation groove 60 which isolates first electrode 50*n* and second electrode 50*p* from each other is provided on insulating layer 40 provided on a surface of first semiconductor layer 20*n* also in this embodiment. Moreover, isolation groove 60 is provided on second semiconductor layer 30*p* on insulating layer 40. Furthermore, isolation groove 60 is provided in transparent electrode layer 52*p* provided on second semiconductor layer 30*p* on insulating layer 40. In addition, as shown in FIG. 4, center 60M of isolation groove 60 in arrangement direction X is closer to center 30*p*M of second semiconductor layer 30*p* in arrangement direction x than center 40M of insulating layer 40 in arrangement direction x is. In other words, distance L60 from center 30*p*M of second semiconductor layer 30*p* to center 60M of isolation groove 60 is shorter than distance L40 from center 30*pm* of second semiconductor layer 30*p* to center 40M of insulating layer 40. Isolation groove 60 is not located at the center of insulating layer 40 but is formed to be offset to a p-type semiconductor layer in arrangement direction x.

(3) Method for Manufacturing Solar Cell 1B

Figure 5:
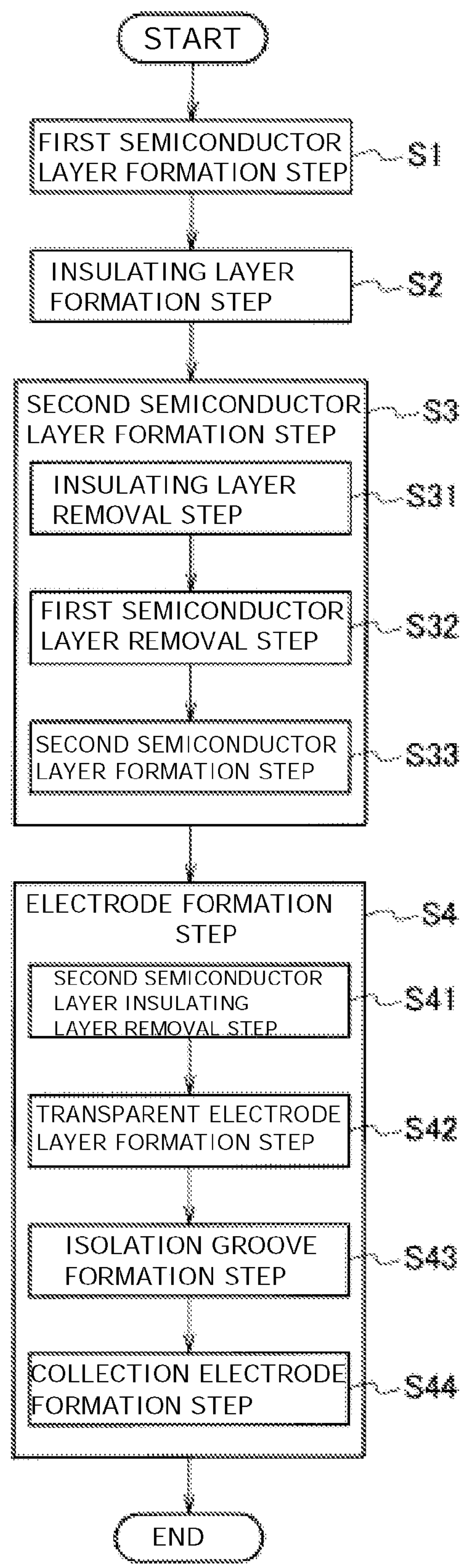
FIG. 5 is a flowchart for explaining a method for manufacturing solar cell 1B according to the embodiment of the invention.

A method for manufacturing solar cell 1B according to the embodiment of the invention is described with reference to FIGS. 5 to 12. FIG. 5 is a flowchart for explaining the method for manufacturing solar cell 1B according to the embodiment of the invention. FIGS. 6 to 12 are views for explaining the method for manufacturing solar cell 1B according to the embodiment of the invention.

As shown in FIG. 5, the method for manufacturing solar cell 1B includes steps S1 to S4.

Step S1 is a step of forming first semiconductor layer 20*n* having the first conductivity type on rear surface 12 of semiconductor substrate 10*n* of the first conductivity type. First, semiconductor substrate 10*n* is prepared. Semiconductor substrate 10*n* is subjected to etching using an acid or alkaline solution to remove contaminants on semiconductor substrate 10*n*. A texture structure for reducing light reflection is formed on the light-receiving surface of semiconductor substrate 10*n*. The rear surface of semiconductor substrate 10*n* is formed to be flatter than the light-receiving surface. i-type amorphous semiconductor layer 22*i* is formed on rear surface 12 of thus-prepared semiconductor substrate 10*n*. n-type amorphous semiconductor layer 25*n* is formed on thus-formed i-type amorphous semiconductor layer 22*i*. i-type amorphous semiconductor layer 22*i* and n-type amorphous semiconductor layer 25*n* are formed by, for example, a chemical vapor deposition method (CVD method). First semiconductor layer 20*n* is formed on rear surface 12 in step S1.

Figure 6:
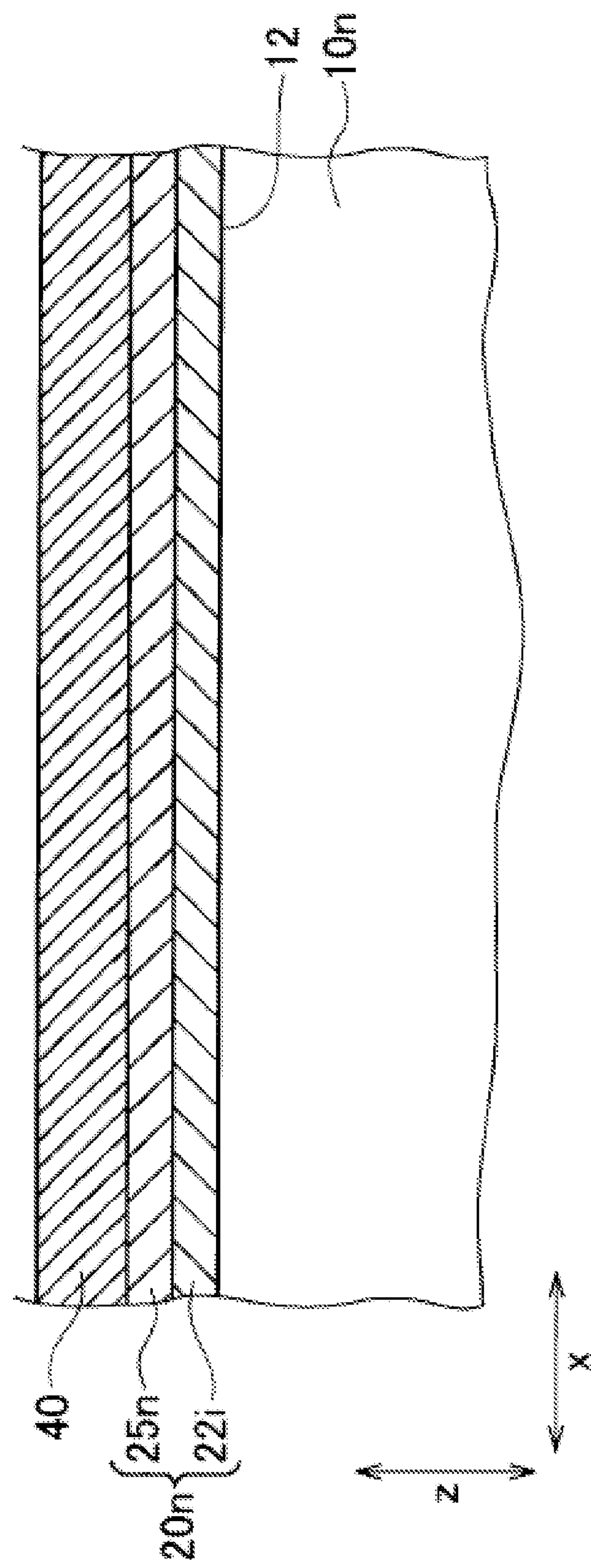
FIG. 6 is a view for explaining the method for manufacturing solar cell 1B according to the embodiment of the invention.

Step S2 is a step of forming insulating layer 40 having insulation properties. Insulating layer 40 is formed on first semiconductor layer 20*n* formed in step S1. Specifically, as shown in FIG. 6, insulating layer 40 is formed on n-type amorphous semiconductor layer 25*n*. Insulating layer 40 is formed by, for example, the CVD method.

Step S3 is a step of forming second semiconductor layer 30*p* having the second conductivity type on rear surface 12 of semiconductor substrate 10*n* of the first conductivity type. Step S3 includes steps S31 to S33.

Figure 7:
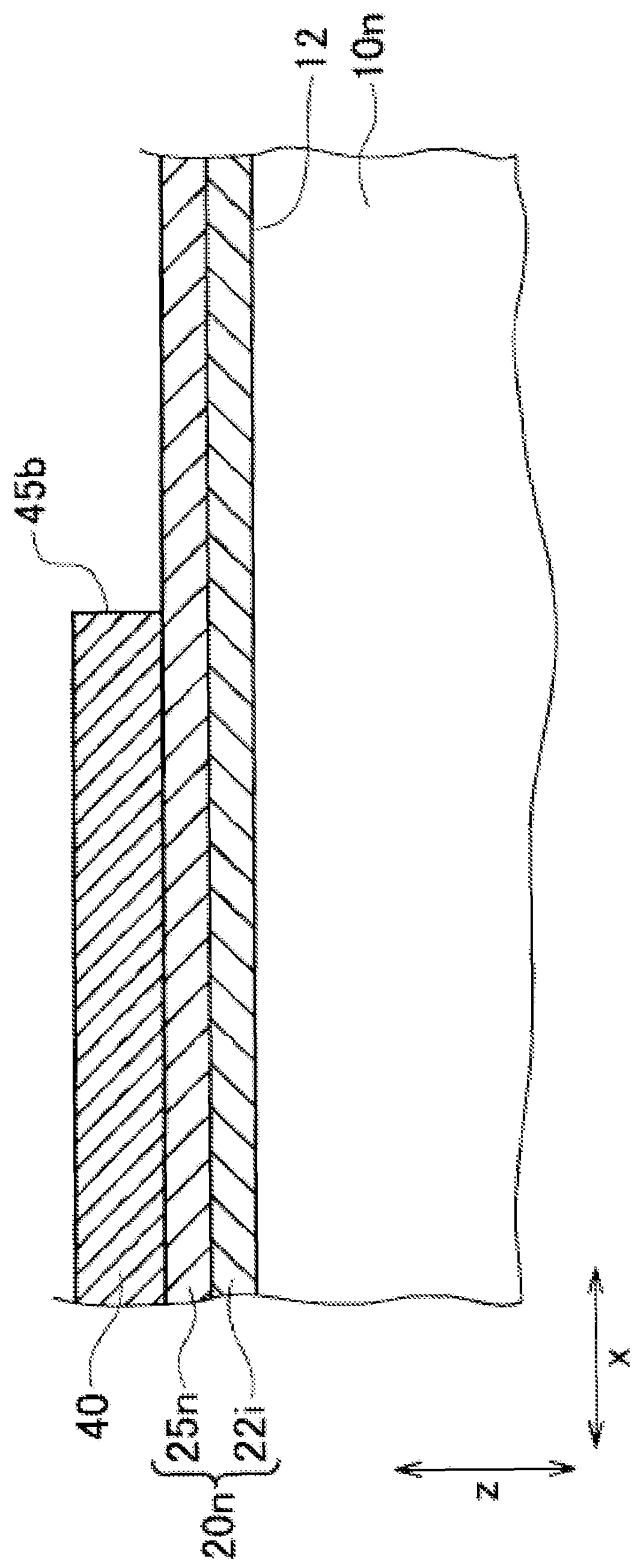
FIG. 7 is a view for explaining the method for manufacturing solar cell 1B according to the embodiment of the invention.

Step S31 is a step of removing insulating layer 40 formed on first semiconductor layer 20*n*. A resist is applied onto insulating layer 40 by using a photolithography method or a screen printing method. When rear surface 12 is viewed in perpendicular direction z, the resist is applied onto insulating layer 40 in portions where second semiconductor layer 30*p* is to be formed. Thereafter, portions of insulating layer 40 which are not covered with the resist are dissolved and removed by using an etchant. First semiconductor layer 20*n* is thereby exposed as shown in FIG. 7. Moreover, second insulating-layer end portion 45*b* appears. First semiconductor layer 20*n* is also partially removed in some cases depending on processing conditions.

Examples of methods other than forming a pattern by using a resist include a method of partially removing insulating layer 40 by using an etching paste. The methods of partially removing insulating layer 40 are not only limited to these methods and other methods may be used.

Figure 8:
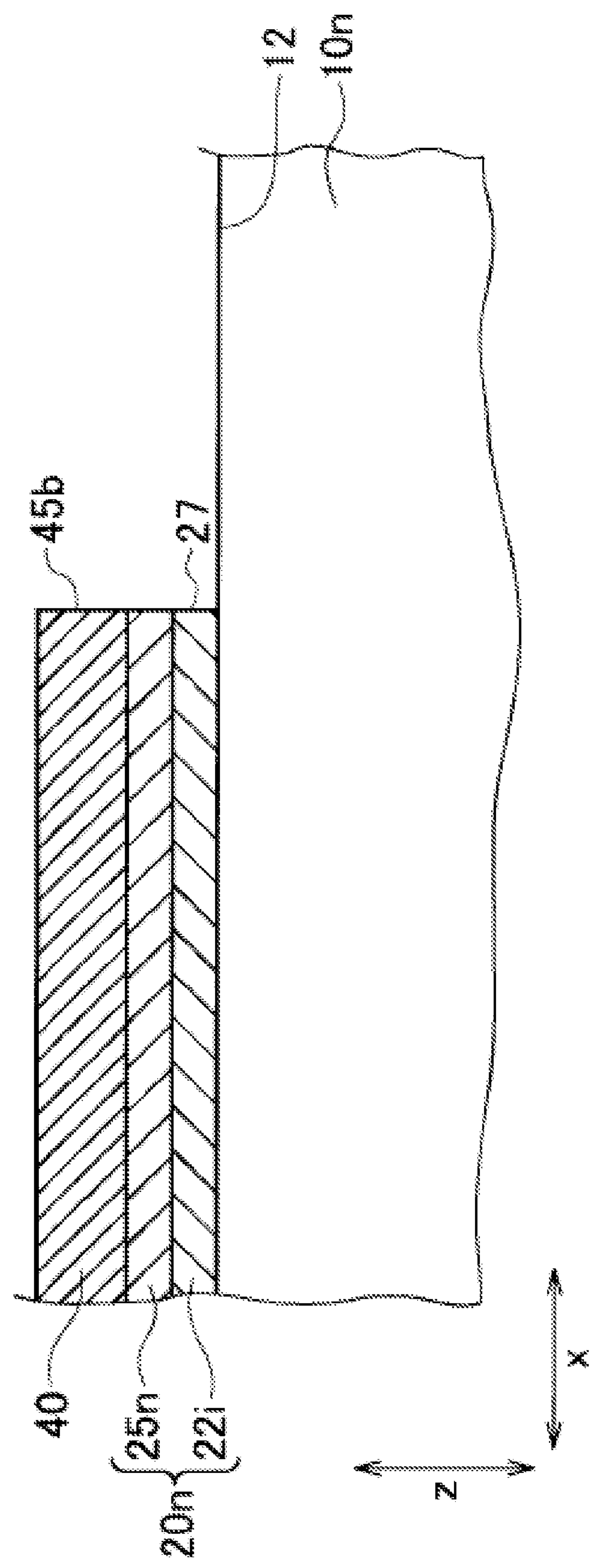
FIG. 8 is a view for explaining the method for manufacturing solar cell 1B according to the embodiment of the invention.

Step S32 is a step of removing first semiconductor layer 20*n* exposed by the removal of insulating layer 40. Exposed first semiconductor layer 20*n* is subjected to alkali cleaning. Semiconductor substrate 10*n* is thereby exposed as shown in FIG. 8. Moreover, first-semiconductor-layer end portion 27 appears. Amount of first-semiconductor-layer end portion 27 removed changes depending on processing conditions. Hence, when insulating layer 40 is formed to be laid on first semiconductor layer 20*n* and second semiconductor layer 30*p* as in solar cell 1A, the processing time is set to be longer for example.

In step S32, insulating layer 40 remaining without being removed serves as a protective film which protects first semiconductor layer 20*n*. Accordingly, the second insulating-layer end portion and the first-semiconductor-layer end portion are formed to be arranged side by side. Moreover, second insulating-layer end portion 45*b* and first-semiconductor-layer end portion 27 are at the same position in arrangement direction x.

Figure 9:
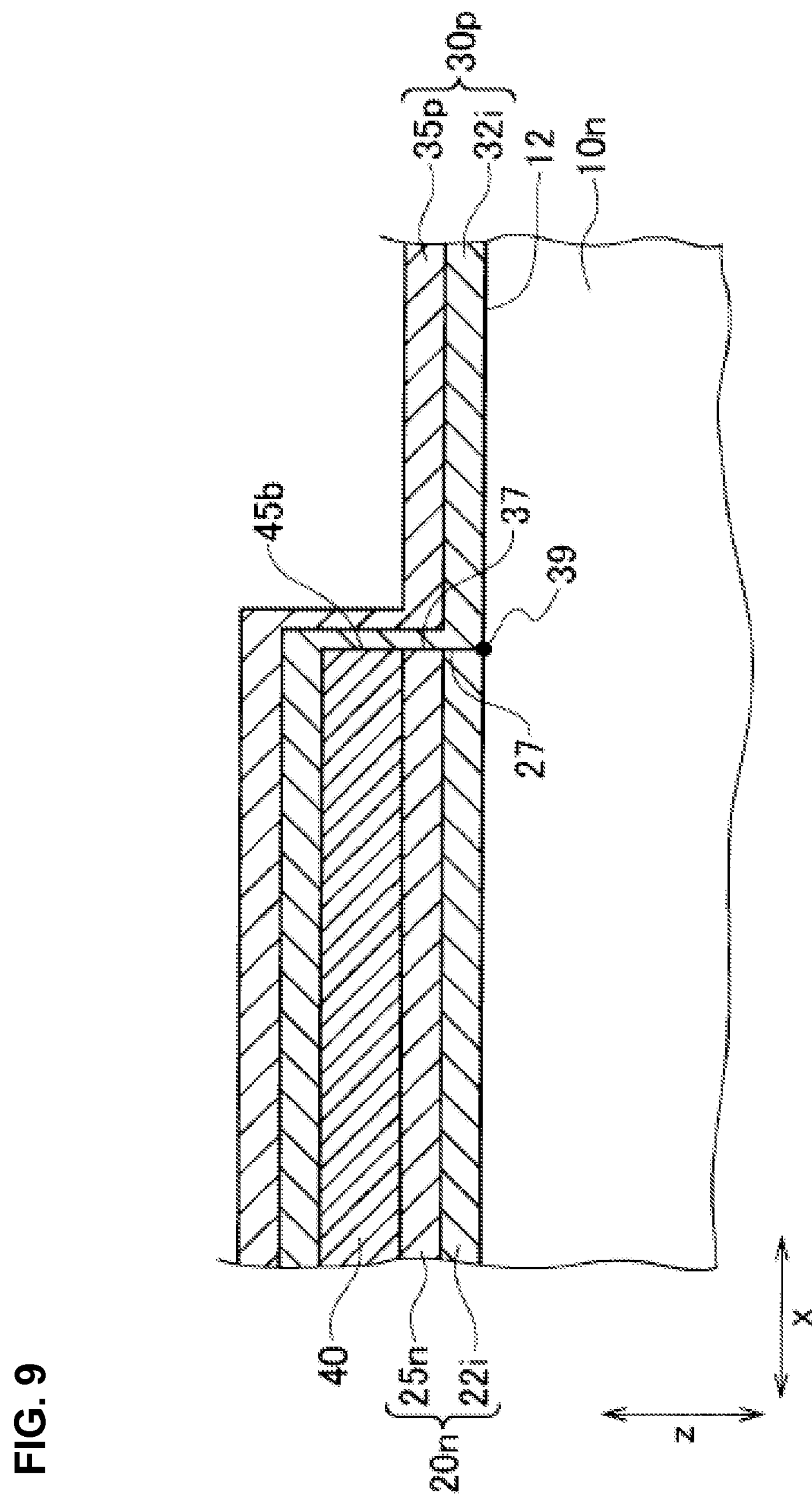
FIG. 9 is a view for explaining the method for manufacturing solar cell 1B according to the embodiment of the invention.

Step S33 is a step of forming second semiconductor layer 30*p* on semiconductor substrate 10*n* exposed by the removal of first semiconductor layer 20*n*. i-type amorphous semiconductor layer 32*i* is formed on rear surface 12 of semiconductor substrate 10*n*. p-type amorphous semiconductor layer 35*p* is formed on thus-formed i-type amorphous semiconductor layer 32*i*. i-type amorphous semiconductor layer 32*i* and p-type amorphous semiconductor layer 35*p* are formed by, for example, the CVD method. Second semiconductor layer 30*p* is formed on rear surface 12 in step S33. As shown in FIG. 9, second semiconductor layer 30*p* is formed over the entire surface of solar cell 1B. Hence, second semiconductor layer 30*p* is formed not only on rear surface 12 but also on insulating layer 40. Moreover, second semiconductor layer 30*p* covers second insulating-layer end portion 45*b* and first-semiconductor-layer end portion 27. Second-semiconductor-layer end portion 37 is an end portion of second semiconductor layer 30*p* formed on rear surface 12. Hence, first-semiconductor-layer end portion 27 and second-semiconductor-layer end portion 37 are in contact with each other.

Step S4 is a step of forming first electrode 50*n* and second electrode 50*p*. Step S4 includes steps S41 to S44.

Figure 10:
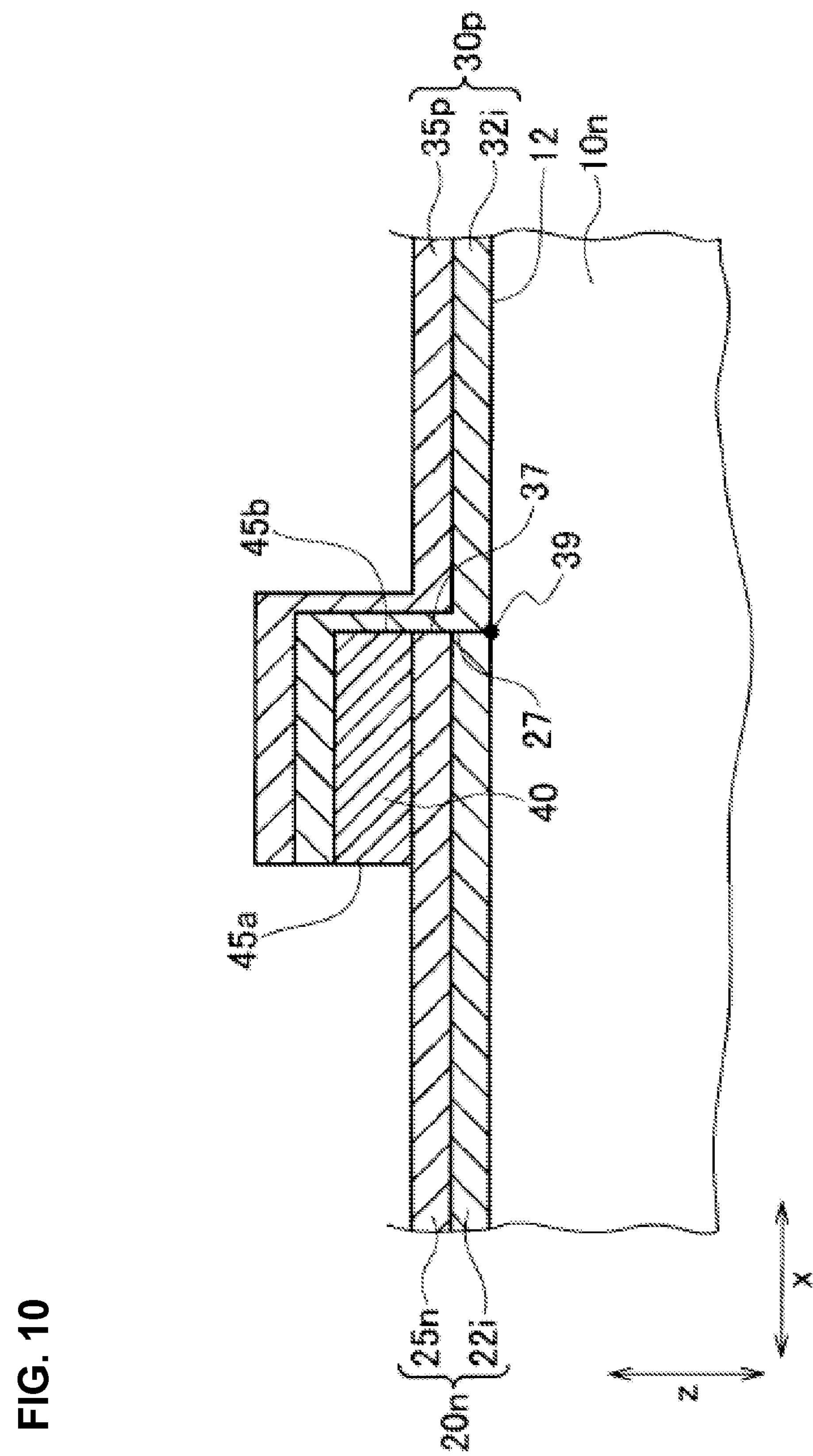
FIG. 10 is a view for explaining the method for manufacturing solar cell 1B according to the embodiment of the invention.

Step S41 is a step of removing second semiconductor layer 30*p* and insulating layer 40. A resist is applied onto second semiconductor layer 30*p* formed on insulating layer 40, in a portion where second semiconductor layer 30*p* is desired to be left, by using the photolithography method or the screen printing method. Thereafter, processing using an etchant is performed and a portion of second semiconductor layer 30*p* and a portion of insulating layer 40 on which the resist is applied thereby are left as shown in FIG. 10. A portion of second semiconductor layer 30*p* and a portion of insulating layer 40 on which no resist is applied are removed. In a case where insulating layer 40 is not completely removed and remains, cleaning is performed by using hydrogen fluoride (HF). First semiconductor layer 20*n* is thus exposed by this cleaning. Moreover, first insulating-layer end portion 45*a* appears. Second semiconductor layer 30*p* and insulating layer 40 may be separately removed. Moreover, as in step S31, second semiconductor layer 30*p* and insulating layer 40 may be removed by methods other than the method using the resist.

Figure 11:
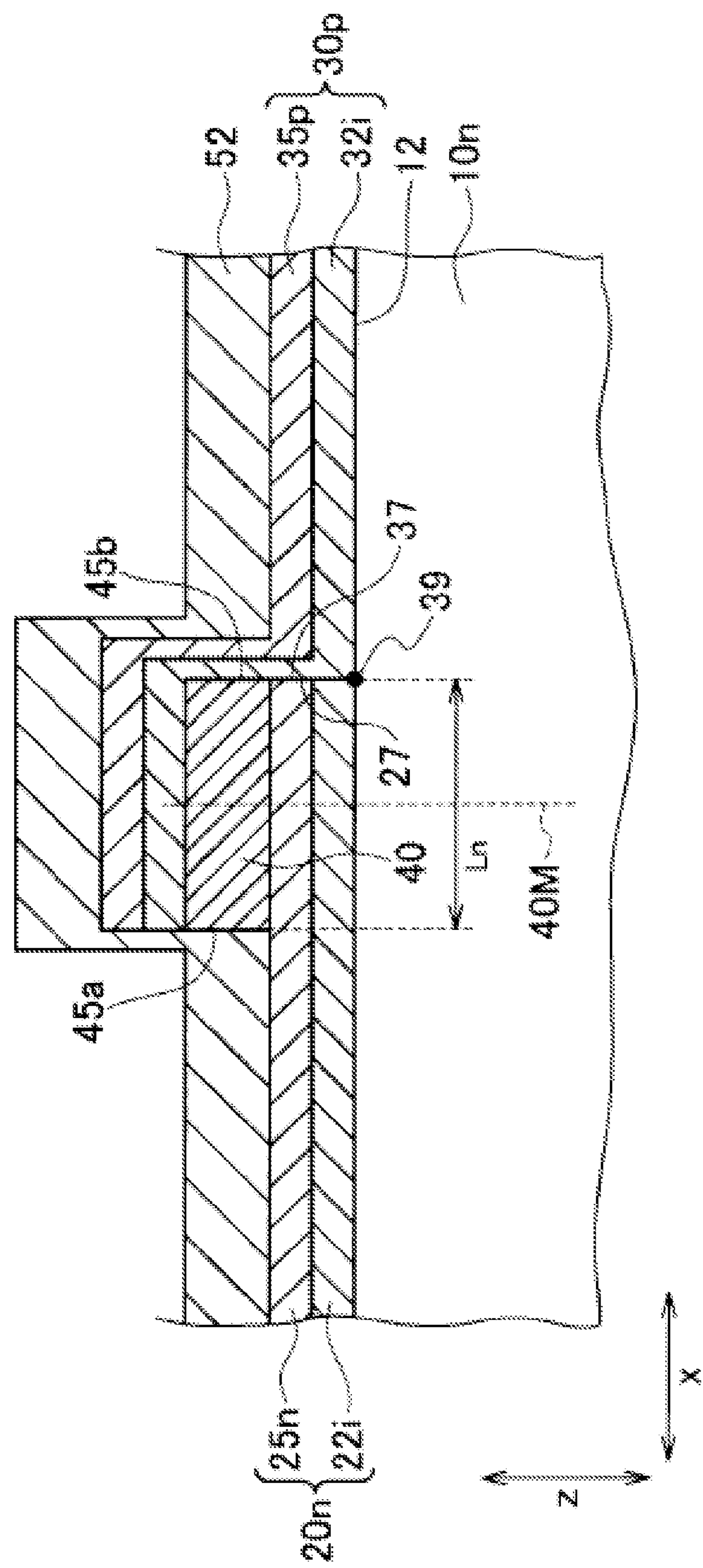
FIG. 11 is a view for explaining the method for manufacturing solar cell 1B according to the embodiment of the invention.
Figure 12:
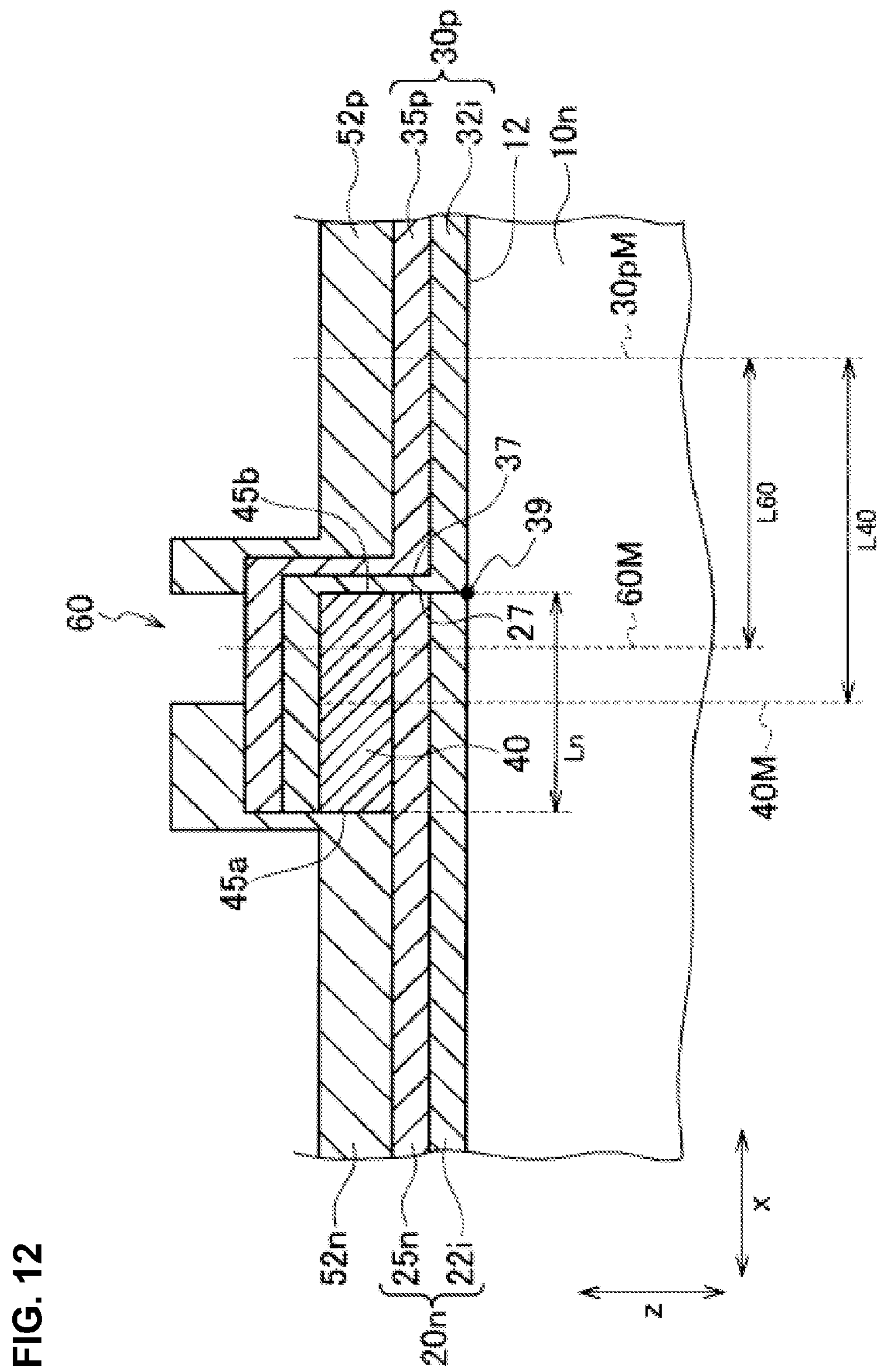
FIG. 12 is a view for explaining the method for manufacturing solar cell 1B according to the embodiment of the invention.

Step S42 is a step of forming transparent electrode layer 52. As shown in FIG. 11, transparent electrode layer 52 is formed on first semiconductor layer 20*n* and second semiconductor layer 30*p* by using a physical vapor deposition method (PVD method). Thereafter, an underlying metal layer serving as an underlying layer for collection electrodes 55 may be formed by using the PVD method. For example, Ti and Cu are used as underlying metals.

Step S43 is a step of forming isolation groove 60 for preventing short circuit. Isolation groove 60 is formed by using a laser. Isolation groove 60 is provided in transparent electrode 52 formed on second semiconductor layer 30*p*. Second semiconductor layer 30*p* herein is second semiconductor layer 30*p* formed on insulating layer 40. Isolation groove 60 is provided in transparent electrode 52 because first semiconductor layer 20*n* or second semiconductor layer 30*p* may otherwise be damaged by the laser. This is similar in the case where isolation groove 60 is formed by methods other than the method using the laser, such as one using a resist and an etchant for example.

Although a radiation port of laser and a resist pattern are aligned to form isolation groove 60 at an appropriate position, minor misalignment occurs. In consideration of this minor misalignment, isolation groove 60 is formed in solar cell 1A in such a way that center 60M of isolation groove 60 coincides with center 40M of insulating layer 40 in arrangement direction x.

Meanwhile, in solar cell 1B, isolation groove 60 is formed to be offset to p-type second semiconductor layer 30*p* in arrangement direction x. Specifically, center 60M of isolation groove 60 is formed closer to center 30*p*M of second semiconductor layer 30*p* than center 40M of insulating layer 40 is in arrangement direction x. By performing such positioning, damages caused by the laser or the etchant on first semiconductor layer 20*n* being an n-type semiconductor layer can be avoided even when the width of insulating layer 40 in arrangement direction x is reduced. Hence, insulating layer 40 can be designed to be smaller in width. This reduces the distance that minor carriers generated under first semiconductor layer 20*n* move to second semiconductor layer 30*p* via a portion under insulating layer 40. Accordingly, efficiency deterioration caused by the recombination of minor carries can be suppressed.

Step S44 is a step of forming collection electrodes 55. A conductive paste is applied onto transparent electrode 52 by the screen printing method. Thereafter, collection electrodes 55 are formed by sintering the conductive paste. Collection electrodes 55 may be formed on transparent electrode 52 by plating. Solar cell 1B shown in FIG. 4 is thus formed.

(4) Operations and Effects

In solar cell 1 of the embodiment of the invention, distance Lp from end point 39 to second insulating-layer end portion 45*b* in arrangement direction x is shorter than distance Ln from end point 39 to first insulating-layer end portion 45*a* in arrangement direction x. This reduces the distance that the minor carriers generated near first semiconductor layer 20*n* in semiconductor substrate 10*n* travel through the portion near the junction between semiconductor substrate 10*n* and second semiconductor layer 30*p* covered with insulating layer 40, when the minor carriers move to the second electrode 50*p*. Accordingly, in solar cell 1, the distance that the minor carriers travel under second semiconductor layer 30*p* to reach second electrode 50$p$ is shorter and the recombination of minor carries can be reduced compared to a solar cell in which the width of insulating layer 40 in arrangement direction x is the same.

In solar cell 1 according to the embodiment of the invention, the distance Lp from end point 39 to second insulating-layer end portion 45$b$ in arrangement direction x is 0.1 mm or smaller. When the distance Lp is 0.1 mm or smaller, the number of minor carriers which recombine is small and the conversion efficiency is thereby improved.

In solar cell 1B according to the embodiment of the invention, second insulating-layer end portion 45$b$ and first-semiconductor-layer end portion 27 are arranged side by side. Moreover, second insulating-layer end portion 45$b$ and first-semiconductor-layer end portion 27 are at the same position in arrangement direction x. The minor carries can move to second electrode 50$p$ without traveling through the portion near the junction between semiconductor substrate 10$n$ and second semiconductor layer 30$p$ covered with insulating layer 40.

In solar cell 1B according to the embodiment of the invention, center 60M of isolation groove 60 is closer to center 30$p$M of second semiconductor layer 30$p$ being the p-type semiconductor than center 40M of insulating layer 40 is. Accordingly, in first semiconductor layer 20$n$ being the n-type semiconductor layer, no damage occurs due to formation of isolation groove 60 even when the width of insulating layer 40 is small. Reducing the width of insulating layer 40 reduces the distance that the minor carriers generated under first semiconductor layer 20$n$ travel to reach second electrode 50$p$. Accordingly, loss due to recombination of minor carriers can be reduced.

In the method for manufacturing solar cell 1 according the embodiment of the invention, first semiconductor layer formation step S1, insulating layer formation step S2, and second semiconductor layer formation step S3 are performed in this order. Second semiconductor layer formation step S3 includes step S31 of removing insulating layer 40 formed on first semiconductor layer 20$n$, step S32 of removing first semiconductor layer 20$n$ exposed by the removal of insulating layer 40, and step S33 of forming second semiconductor layer 30$p$ on semiconductor substrate 10$n$ exposed by the removal of first semiconductor layer 20$n$. In this method, insulating layer 40 can be used as the protective film for first semiconductor layer 20$n$. Hence, the second insulating-layer end portion and the first-semiconductor-layer end portion are formed to be arranged in side by side. Moreover, second insulating-layer end portion 45$b$ and first-semiconductor-layer end portion 27 are formed at the same position in arrangement direction x.

In the method for manufacturing solar cell 1B according to the embodiment of the invention, center 60M of isolation groove 60 is formed to be closer to center 30$p$M of second semiconductor layer 30$p$ than center 40M of insulating layer 40 is in isolation groove formation step S43. Accordingly, first semiconductor layer 20$n$ being the n-type semiconductor layer is not exposed in the surface and is thereby not damaged by the etchant and the like. Moreover, when isolation groove 60 is formed by using the laser, first semiconductor layer 20$n$ is not damaged by the laser. Accordingly, insulating layer 40 can be designed to be small in width and connection portion between semiconductor substrate 10$n$ and first semiconductor layer 20$n$ under insulating layer 40 can be made smaller. Hence, the distance that the minor carriers travel under first semiconductor layer 20$n$ can be made shorter. Furthermore, the smaller the width of insulating layer 40 is, the larger the width of first electrode 50$n$ (transparent electrode layer 52$n$) in arrangement direction x can be made, first electrode 50$n$ formed on first semiconductor layer 20$n$ formed on semiconductor substrate 10$n$. Accordingly, resistance loss of an electric current can be reduced.

(5) Other Embodiments

The contents of the invention are disclosed above by using the embodiment of the invention. However, it should not be understood that descriptions and drawings which form part of this disclosure limit the invention.

Figure 13:
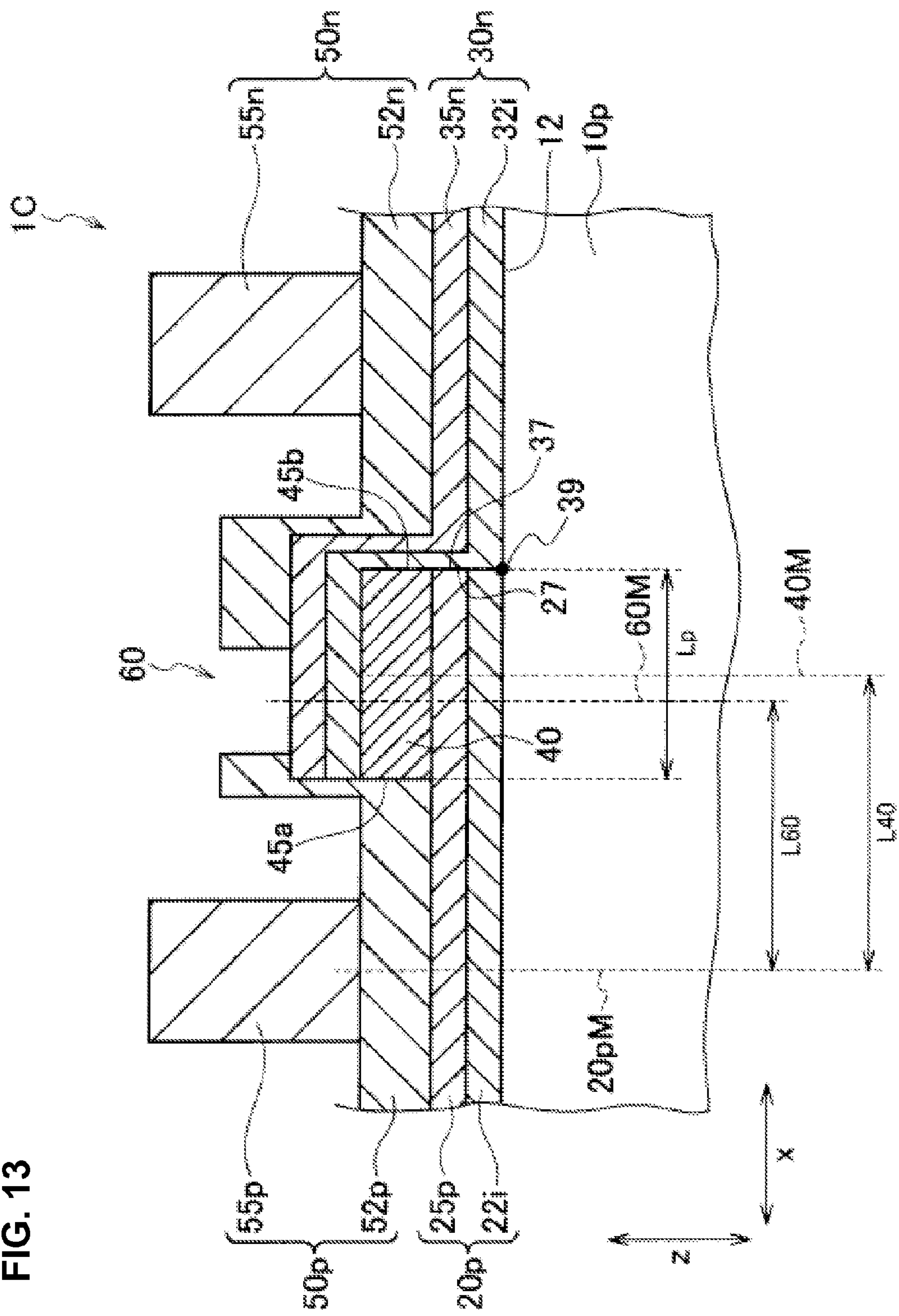
FIG. 13 is a cross-sectional view of solar cell 1C according to the embodiment of the invention which is taken along a cross section extending in perpendicular direction z and arrangement direction x.

In solar cell 1 according to the embodiment of the invention, the conductivity type of semiconductor substrate 10$n$ is n-type. However, the invention is not limited to this. As shown in FIG. 13, p-type semiconductor substrate 10$p$ may be used. In this case, the minor carriers are electrons. Accordingly, in solar cell 1C, distance Lp from end point 39 to first insulating layer end portion 45$a$ in arrangement direction x is longer than distance Ln from end point 39 to second insulating layer end portion 45$b$ in arrangement direction x. In FIG. 13, second insulating-layer end portion 45$b$ and first-semiconductor-layer end portion 27 are arranged side by side. Moreover, second insulating-layer end portion 45$b$ and first-semiconductor-layer end portion 27 are at the same position in arrangement direction x.

In solar cell 1C, center 60M of isolation groove 60 is closer to center 20$p$M of the first semiconductor layer being the p-type semiconductor layer in arrangement direction x than center 40M of insulating layer 40 is in arrangement direction x.

Figure 14:
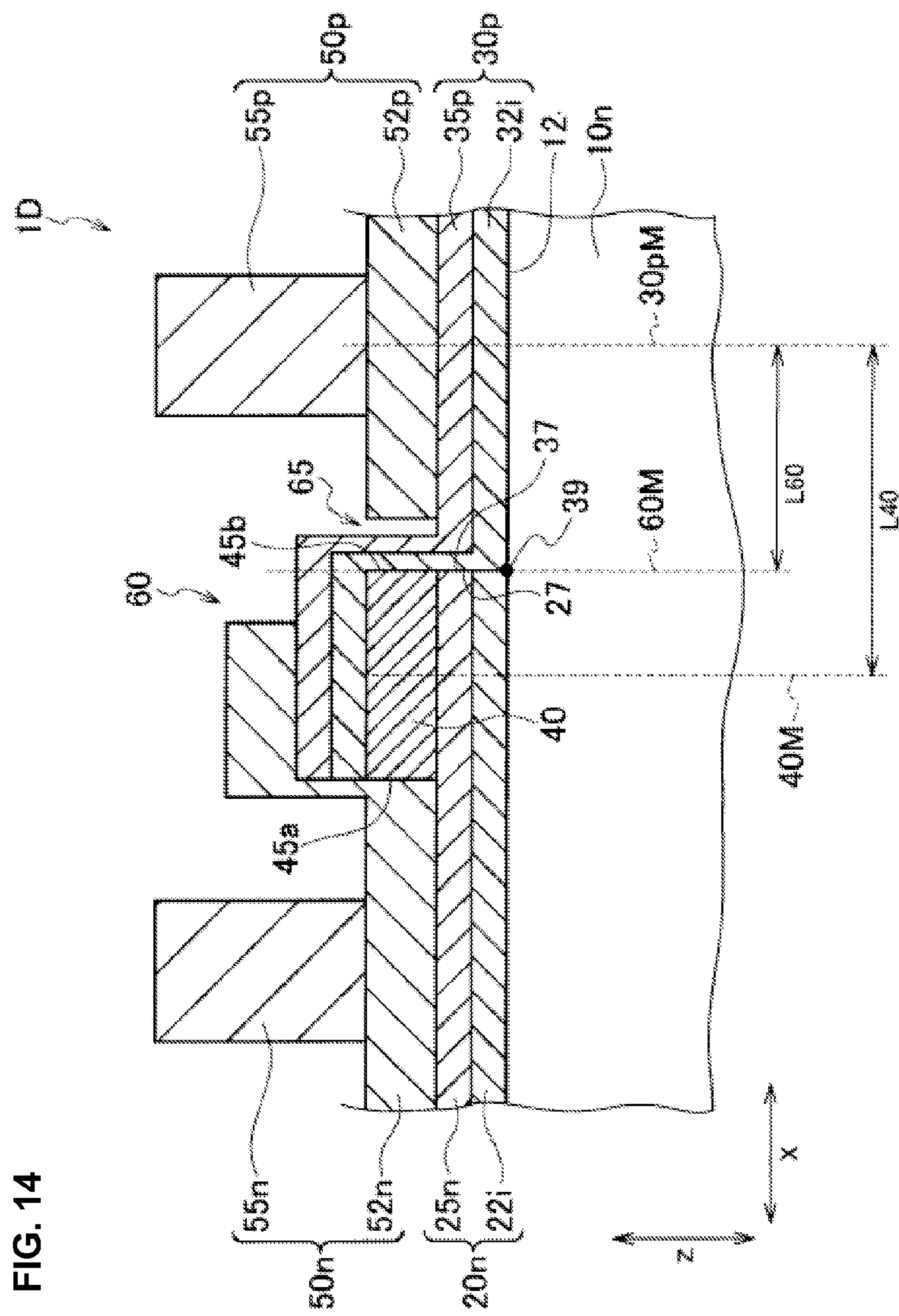
FIG. 14 is a cross-sectional view of solar cell 1D according to the embodiment of the invention which is taken along a cross section extending in perpendicular direction z and arrangement direction x.

In solar cell 1 according to the embodiment of the invention, isolation groove 60 is provided in transparent electrode 52 formed on second semiconductor layer 30$p$ formed on insulating layer 40. However, as shown in FIG. 14, part of isolation groove 60 may be provided in transparent electrode 52 formed on second semiconductor layer 30$p$ formed on rear surface 12 due to misalignment. When the thickness of second semiconductor layer 30$p$ covering second insulating-layer end portion 45$b$ and first-semiconductor-layer end portion 27 is small, there is a possibility of short circuit occurring since the distance between transparent electrode layer 52$p$ and first semiconductor layer 20$n$ is close. Forming isolation groove 65 being part of isolation groove 60 reduces the possibility of such short circuit occurring. Although damage occurs in second semiconductor layer 30$p$ formed on rear surface 12 due to the formation of isolation groove 65, a damage caused by the damage in the p-type semiconductor layer is sufficiently smaller than a damage caused by the damage in the n-type semiconductor layer. In view of this, the isolation groove 65 may be provided in transparent electrode 52 formed on second semiconductor layer 30$p$ formed on rear surface 12 to prevent short circuit.

As described above, the invention includes various embodiments which are not described herein. Accordingly, the technical scope of the invention should be determined only by the matters to define the invention in the scope of claims regarded as appropriate based on the above description.

The invention claimed is:

1. A solar cell comprising:

a semiconductor substrate of a first conductivity type having a light-receiving surface and a rear surface;

a first semiconductor layer having the first conductivity type on the rear surface;

a second semiconductor layer having a second conductivity type on the rear surface;

a first electrode electrically connected to the first semiconductor layer;

a second electrode electrically connected to the second semiconductor layer; and an insulating layer having insulation properties, wherein the second semiconductor layer is located on the insulating layer, the second semiconductor layer physically contacting a front surface, a rear surface and a side surface of the insulating layer, the front surface of the insulating layer being substantially parallel to the rear surface of the insulating layer and being disposed further apart from the semiconductor substrate than the rear surface of the insulating layer, the first semiconductor layer and the second semiconductor layer contact each other at an interface such that the insulating layer is positioned on the interface between the first semiconductor layer and the second semiconductor layer and on both the first semiconductor layer and the second semiconductor layer, and when an end portion of the first semiconductor layer is defined as a first-semiconductor-layer end portion, an end portion of the second semiconductor layer which is adjacent to the first semiconductor layer is defined as a second-semiconductor-layer end portion, one end portion of the insulating layer which is formed on the first semiconductor layer and which is facing the first electrode is defined as a first insulating-layer end portion, and another end portion of the insulating layer facing the second electrode is defined as a second insulating-layer end portion, in an arrangement direction in which the first semiconductor layer and the second semiconductor layer are alternately arranged, a distance from an end point of the second-semiconductor-layer end portion in contact with the second insulating-layer end portion in the arrangement direction is shorter than a distance from the end point to the first insulating-layer end portion in the arrangement direction.

2. The solar cell according to claim 1, wherein the distance from the end point to the second insulating-layer end portion in the arrangement direction is 0.1 mm or smaller.

3. The solar cell according to claim 1, wherein the second insulating-layer end portion and the first-semiconductor-layer end portion are arranged side by side.

4. The solar cell according to claim 1, wherein the second insulating-layer end portion and the first-semiconductor-layer end portion are at the same position in the arrangement direction.

5. The solar cell according to claim 1, further comprising an isolation groove for preventing short circuit, wherein the isolation groove is located on the insulating layer.

6. The solar cell according to claim 5, wherein when a semiconductor layer having a p-type conductivity out of the first semiconductor layer formed on the rear surface and the second semiconductor layer formed on the rear surface is defined as a p-type semiconductor layer, a center of the isolation groove is closer to a center of the p-type semiconductor layer than a center of the insulating layer is in the arrangement direction.

7. The solar cell according to claim 1, wherein an entire light-receiving surface is capable of receiving light.

8. The solar cell according to claim 7, wherein the light-receiving surface is covered with a passivation layer.

9. The solar cell according to claim 8, wherein the passivation layer includes a substantially intrinsic amorphous semiconductor layer.

10. The solar cell according to claim 7, wherein the light-receiving surface has a texture structure.

11. The solar cell according to claim 10, wherein the rear surface of the semiconductor substrate is formed to be flatter than the light-receiving surface.

12. The solar cell according to claim 10, wherein the rear surface of the semiconductor substrate is formed to be flatter than the light-receiving surface.

13. The solar cell according to claim 1, wherein the first semiconductor layer and the second semiconductor layer are alternately arranged as components of a common layer having a first surface in contact with the semiconductor substrate and in which the first semiconductor layer and the second semiconductor layer abut each other at vertical interfaces under the insulating layer, wherein a second surface of the common layer opposite to the first layer and positioned furthest from the semiconductor substrate is provided at a predetermined distance from the semiconductor substrate along an entire length of the common layer.

14. The solar cell according to claim 1, wherein the insulating layer is located solely below the second semiconductor layer.

15. A solar cell comprising:

a semiconductor substrate of a first conductivity type having a light-receiving surface and a rear surface;

a first semiconductor layer having the first conductivity type on the rear surface;

a second semiconductor layer having a second conductivity type alternately arranged with the first semiconductor layer on the rear surface to form a combined layer, and the second semiconductor layer vertically abutting the first semiconductor layer, thereby forming an abutment interface in the combined layer;

a first electrode electrically connected to the first semiconductor layer;

a second electrode electrically connected to the second semiconductor layer; and an insulating layer located between a portion of the second semiconductor layer and a portion of the first semiconductor layer, wherein the insulating layer is disposed further apart from the semiconductor substrate than the first semiconductor layer, the insulating layer area is disposed further apart from the semiconductor substrate than the abutment interface, and the insulating layer area is disposed further apart from the semiconductor substrate than a portion of the second semiconductor layer that is adjacent to the abutment interface, wherein the second semiconductor layer physically contacts a front surface, a rear surface and a side surface of the insulating layer, the front surface of the insulating layer being substantially parallel to the rear surface of the insulating layer and being disposed further apart from the semiconductor substrate than the rear surface of the insulating layer.

16. The solar cell of claim 15, wherein the portion of the second semiconductor layer adjacent to the abutment interface is 0.1 mm or smaller.

17. The solar cell of claim 15, wherein the insulating layer is completely covered by the second semiconductor layer, has a first side covered and in contact with a portion of the second semiconductor layer that is disposed further apart from the semiconductor substrate than the first semiconductor layer, and has an opposite second side in contact with the first electrode.

18. The solar cell of claim 15, wherein the first semiconductor layer is completely covered by the insulating layer and the first electrode.

19. The solar cell of claim 15, wherein the portion of the second semiconductor layer adjacent to the abutment interface extends under the insulating layer sufficient to suppress recombination of minority carriers under the adjacent first semiconductor layer.

20. The solar cell of claim 17, wherein the second semiconductor layer has a first section that, together with the first semiconductor layer, forms a combined layer that is rectangular in shape and that is a predetermined distance from the semiconductor substrate, wherein the second semiconductor layer has a second section contiguous with the first section, the second section corresponding to the portion of the second semiconductor layer that is disposed further apart from the semiconductor substrate than the first semiconductor layer, the second section extending in a direction substantially perpendicular to the first section, and wherein the second semiconductor layer has a third section extending in a direction substantially parallel to the first section, the third section contiguous with the second section and not contiguous with the first section.

21. The solar cell of claim 20, wherein the insulating layer is sandwiched between the third section of the second semiconductor layer and the combined layer.

* * * * *